(12) United States Patent  
Daly et al.

(10) Patent No.: US 9,998,001 B1  
(45) Date of Patent: Jun. 12, 2018

(54) ZENO PHENOMENON AVOIDANCE IN POWER CONTROLLER HANDOFF

(71) Applicant: Analog Devices, Inc., Norwood, MA (US)

(72) Inventors: Michael Daly, San Jose, CA (US); Subodh Prakash Madiwale, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days. days.

(21) Appl. No.: 15/466,407

(22) Filed: Mar. 22, 2017

(51) Int. Cl.
*G05F 1/10* (2006.01)
*H02M 3/07* (2006.01)
*H03K 3/0233* (2006.01)

(52) U.S. Cl.
CPC .......... *H02M 3/07* (2013.01); *H03K 3/02337* (2013.01)

(58) Field of Classification Search
None
See application file for complete search history.

(56) References Cited

U.S. PATENT DOCUMENTS

| | | | |
|---|---|---|---|
| 3,600,663 A | 8/1971 | Wagner et al. | |
| 3,900,823 A | 8/1975 | Sokal et al. | |
| 4,785,406 A | 11/1988 | Lunderius et al. | |
| 2012/0218250 A1* | 8/2012 | Pei | G09G 3/3655 345/212 |

* cited by examiner

*Primary Examiner* — Cassandra Cox
(74) *Attorney, Agent, or Firm* — Schwegman Lundberg & Woessner, P.A.

(57) ABSTRACT

A control circuit eliminates the Zeno phenomenon in a power supply controller while transferring control from a primary side controller to a secondary side controller. The primary side controller generates a feedback voltage (e.g., threshold voltage) that is input to a comparator. An output node voltage of the control circuit is fed back to the linear amplifier to be compared with the threshold voltage. While the output node voltage is less than the threshold voltage, a charge pump is coupled to the output node of the control circuit. After the output node voltage has toggled around the threshold voltage a number of times, the comparator output node is coupled to the output node of the control circuit and the charge pump is decoupled from the output node. When the output node voltage has discharged to be equal to the threshold voltage, control is handed off from the primary side controller to the secondary side controller.

20 Claims, 4 Drawing Sheets

ZENO PHENOMENON AVOIDANCE IN POWER CONTROLLER HANDOFF

FIELD OF THE DISCLOSURE

This document pertains generally, but not by way of limitation, to the field of integrated circuits and, in particular, to power supply controllers having multiple controllers.

BACKGROUND

The Zeno phenomenon may occur around a boundary situation in which a system is to switch from one state to another state. One simple example of the Zeno phenomenon is the condition statement of "if (x≥0), jump to state 1; else if (x<0), jump to state 2". While this executes accurately in the digital domain, in the analog domain the state of x may be affected by noise, measurement errors, or parasitics. Thus, if x is close to the boundary of 0V, it may traverse that boundary multiple times or even approaching an infinite number of times within a finite time. This causes the state change to have multiple or approaching an infinite number of switches between state 1 and state 2 in the finite time.

The Zeno phenomenon may occur in a system where control is passed from one powering up controller to another powering up controller. During a startup procedure when handing over control from an open loop control to a closed loop control, the Zeno phenomenon may occur during the second controller power-up when the voltage to the second controller reaches a value close to a feedback voltage. This may result in an offset in the output voltage of the system.

SUMMARY OF THE DISCLOSURE

The present inventors have recognized, among other things, that Zeno phenomenon may occur in a system in which control is passed from one powering up controller to another powering up controller. During a startup procedure when handing over control from an open loop control to a closed loop control, the Zeno phenomenon may occur during the second controller power-up when the voltage to the second controller reaches a value close to a feedback voltage. This may result in an offset in the output voltage of the system.

The present inventors have also recognized, among other things, a need for a control circuit for eliminating the Zeno phenomenon from the handover of control from a primary side controller to a secondary side controller of a power supply controller. This document relates generally to forcing a voltage that powers the secondary side controller to be equal to a feedback voltage controlled by the primary side controller.

A control circuit may be used for controlling an output voltage to reduce an offset voltage in the output voltage of the secondary side controller. A linear amplifier has a threshold voltage input node, a feedback voltage input node, and a linear amplifier output node that is switchably coupled to an output node of the control circuit. The feedback voltage input node is coupled to the output node of the control circuit. A charge pump is switchably coupled to the output node of the control circuit. A controller is configured to control coupling of the charge pump to the output node of the control circuit when the output voltage is less than a threshold voltage on the threshold voltage input node. The controller is further configured to control coupling of the linear amplifier output node to the output node of the control circuit when the output voltage is greater than the threshold voltage.

A power supply controller may be used for controlling an output voltage to reduce an offset voltage in the output voltage. A primary controller is coupled to a secondary controller through a micro-transformer. A control circuit is coupled to the secondary controller and to the primary controller through the micro-transformer. The control circuit includes a linear amplifier that has a threshold voltage input node, a feedback voltage input node, and a linear amplifier output node switchably coupled to an output node of the control circuit. The feedback voltage input node is coupled to the output node of the control circuit. A charge pump is switchably coupled to the output node of the control circuit. A controller is configured to control coupling of the charge pump to the output node of the control circuit when the output voltage is less than a threshold voltage on the threshold voltage input node. The controller is further configured to control coupling of the linear amplifier output node to the output node of the control circuit after the output voltage has toggled around the threshold voltage for a number of times.

A method for control handover in a power supply controller includes applying a threshold voltage from a primary controller to a comparator. An output voltage that powers a secondary controller is compared to the threshold voltage. If the output voltage is less than the threshold voltage, a charge pump is coupled to an output of the power supply controller. If the output voltage is greater than the threshold voltage, the charge pump is decoupled from the output of the power supply controller. An output of the linear amplifier is coupled to the output of the power supply controller after the output voltage has toggled around the threshold voltage a number of times. Control of the power supply controller is transferred from the primary controller to the secondary controller when the output voltage equals the threshold voltage after the output voltage has toggled around the threshold voltage for the number of times and the output of the linear amplifier is coupled to the output of the power supply controller.

This section is intended to provide an overview of the subject matter of the present patent application. It is not intended to provide an exclusive or exhaustive explanation of the invention. The detailed description is included to provide further information.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A power supply controller may be used for monitoring an output voltage and controlling power output of a power supply. The power supply controller includes multiple control circuits to perform this task. For example, the power supply controller includes a primary side controller for the initial power-up of the power supply controller and a secondary side controller for completing the power-up sequence of the power supply controller and eventually taking control of the power supply controller from the primary side control circuit. The primary side controller is isolated from the secondary side controller by a transformer (e.g., micro-transformer) so that the two controllers can communicate with each other through the transformer while still maintaining the isolation between the primary side and the secondary side of the controller.

The power-up sequence for the power supply controller includes the primary side controller being powered up first before the secondary side controller. This enables the primary side controller to monitor the input current to the power supply controller. The secondary side controller is then powered by the same controller output voltage ($V_{OUT}$) that is being monitored and controlled by the power supply controller. This operation is illustrated in FIG. 1.

Figure 1:
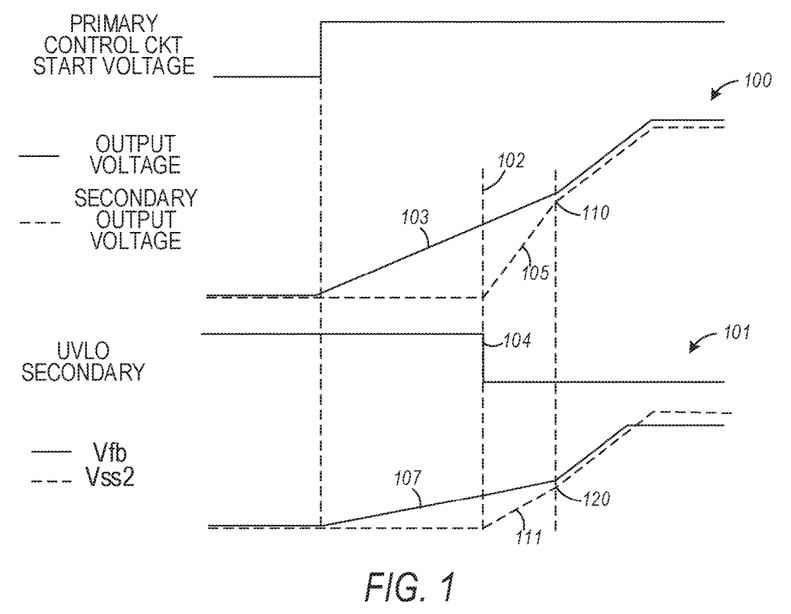
FIG. 1 is a plot of voltages for controlling operation of multiple controllers, such as in accordance with various embodiments.

FIG. 1 is a plot showing voltages for controlling operation of multiple controllers, such as in accordance with various embodiments. The Primary Control Circuit Start voltage 100 is the control voltage that turns on the primary control circuit. It can be seen in FIG. 1, that when the Primary Control Circuit Start Voltage 100 goes from 0V to some fixed voltage greater than 0V, the Output Voltage 103 (i.e., solid line) begins to ramp up from 0V. The Output Voltage 103 is shaped by setting the ramp of a current limit of the primary power controller to control primary side system current.

A feedback voltage $V_{fb}$ 107 also begins to ramp up from 0V when the Primary Output Voltage 103 begins to ramp up. The feedback voltage $V_{fb}$ 107 is the controller output voltage $V_{OUT}$ that is being controlled by the power supply controller. The feedback voltage $V_{fb}$ 107 is generated and controlled by the primary side controller based on the Output Voltage 103.

An under-voltage lock-out (UVLO) voltage 101 is used to indicate a safe turn-on time to the secondary control circuit. The turn-on time may be based on a particular threshold voltage 102 of the Output voltage 103. Thus, the voltage at 102 is the UVLO point for the secondary control circuit to turn on. When the UVLO voltage goes low, that is an indication to the secondary control circuit to begin its power-up.

The UVLO voltage 101 is generated by a UVLO circuit that provides a default lock-out signal 101 (e.g., non-zero voltage) when the power supply controller is powered down or the Output voltage 103 is below a lock-out threshold voltage 102. Upon start-up, as the Output voltage 103 begins to rise, the UVLO voltage 101 can change state 104 when the Output voltage 103 satisfies the lock-out threshold voltage 102. Thus, the UVLO voltage 101 prevents the secondary controller from powering on until the Output Voltage 103 reaches a predetermined value.

In FIG. 1, voltage 105 is a scaled up version of voltage 111. Once UVLO voltage 101 changes state 104 to a low value (e.g., 0V), the secondary controller begins to power on and an internal tracking signal 105 (i.e., dashed line) ramps up from 0V. The internal tracking signal SS2 105 is used on the secondary side of the power supply controller that acts as a reference to control the rise of the output voltage up to the set point voltage in a controlled fashion. The soft start voltage $V_{SS2}$ 111 also begins to ramp up from 0V at this time. It is desirable that both the feedback voltage $V_{fb}$ 107 which is a scaled version of the output voltage 103 through a resistive divider and the Soft Start Voltage $V_{SS2}$ 111 each increase linearly to a respective fixed voltage (e.g., 1.2V-1.4V) without any voltage offsets. A voltage offset in either of the Soft Start Voltage $V_{SS2}$ 111 can cause the same offset to occur in the controller output voltage $V_{OUT}$ that is controlled by the power supply controller.

The control circuit of FIG. 2, as described subsequently, forces $V_{SS2}$ 111 to be equal to $V_{fb}$ 107 prior to transferring control from the primary controller to the secondary controller. This operation is shown in FIG. 1 at voltage 120. This occurs at the voltage 110 where the Secondary Output Voltage 105 and the Output Voltage 103 are substantially equal.

Figure 2:
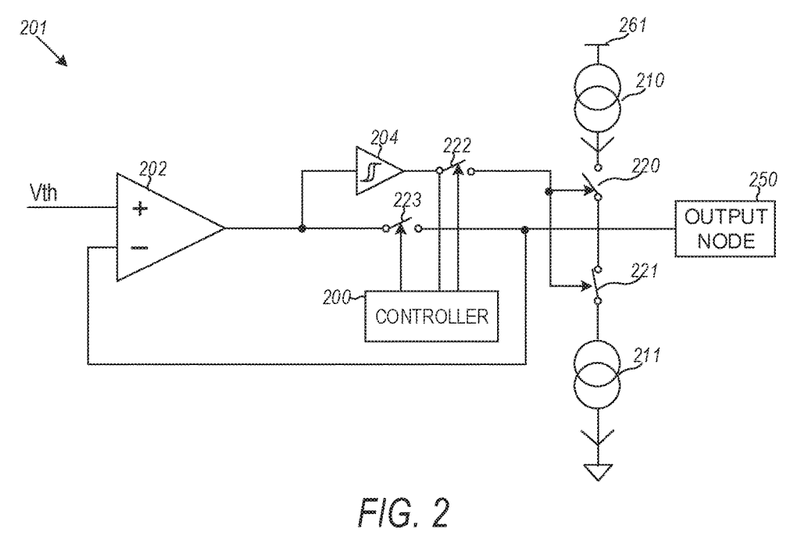
FIG. 2 is a schematic diagram of a control circuit for controlling an output voltage to reduce an offset voltage in the output voltage, such as in accordance with various embodiments.

FIG. 2 is a schematic diagram of the control circuit 201 for controlling the output voltage $V_{OUT}$ to reduce the offset voltage, such as in accordance with various embodiments. The control circuit 201 eliminates or substantially reduces the Zeno Phenomenon that can occur when the secondary control circuit powers up so that an offset voltage is reduced or eliminated in the output voltage $V_{OUT}$.

The control circuit 201 includes a controller 200, a linear amplifier 202, a comparator 204, a first charge pump 210, and a second charge pump 211. In an embodiment, the functions of the linear amplifier 202 and comparator 204 may be combined. A plurality of switches 220, 221, 222, 223 are used to switchably couple the circuit elements. The plurality of switches 220-223 may be implemented by transistors that can be activated and deactivated to respectively couple and decouple a switchably coupled circuit element to another circuit element. The switches 220-223 include a control node (e.g., base or control gate) on which a signal can be applied to either activate or deactivate the switch.

In an embodiment, the linear amplifier 202 can be implemented by an operational amplifier (op amp) configured as a negative feedback amplifier. In this embodiment, the feedback voltage $V_{fb}$ is used as a threshold voltage ($V_{th}$) in the circuit and is coupled to a positive input (e.g., threshold voltage input node) of the linear amplifier 202. Thus, subsequent references to the circuit of FIG. 2 and its method of operation in FIG. 7 refer to the feedback voltage as reference voltage $V_{th}$ since the output node voltage $V_{OUTPUT\_NODE}$ (i.e., SS2 voltage 111 of FIG. 1) is being compared to this input voltage.

The negative input (e.g., feedback voltage input node) of the linear amplifier 202 is coupled to an output node 250 of the circuit. Thus, during circuit operation, the output voltage ($V_{OUTPUT\_NODE}$) at output node 250 is compared to $V_{th}$. $V_{OUTPUT\_NODE}$ is illustrated in FIG. 1 as $V_{SS2}$ 111. The output of the linear amplifier 202 is switchably coupled to the output node 250 through switch 223.

The first charge pump 210 is coupled to a power source node 261 and switchably coupled, through switch 220, to the output node 250. The first charge pump 210 is a source charge pump to supply a current to the output node 250. The second charge pump 211 is coupled to a common circuit node (e.g., circuit ground) and switchably coupled, through switch 221, to the output node 250. The second charge pump 211 is a sink charge pump to remove current from the output node 250. Switches 220 and 221 operate in a complementary manner. In other words, when switch 220 is open, switch 221 is closed and when switch 220 is closed, switch 221 is open.

As used herein, a charge pump may be defined as a DC-to-DC converter that uses capacitors as energy-storage elements to create either a higher or lower voltage power source. Charge-pump circuits may be capable of relatively high efficiencies (e.g., 90-95%).

The comparator 204 has an input coupled to the output of the linear amplifier 202. The output of the comparator 204 is switchably coupled, through switch 222, to the control nodes of switches 220, 221. The comparator 204 includes hysteresis.

The controller 200 is coupled to the control nodes (e.g., base, control gate) of switches 222, 223. Thus, the controller 200 is configured to control the operation (e.g., activation, deactivation) of these switches 222, 223. The controller is also coupled to the output of the comparator 204 in order to track the voltage output from the comparator 204.

Figure 3:
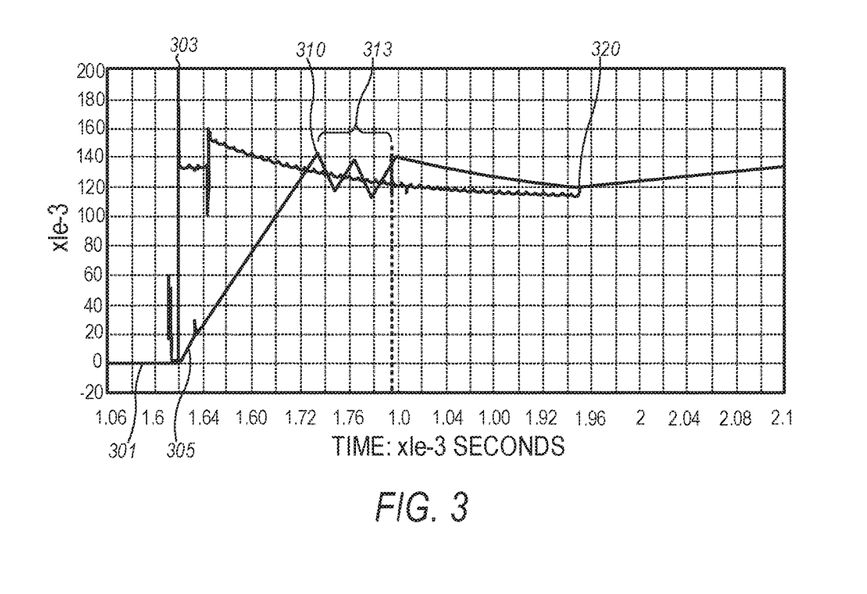
FIG. 3 is a plot of voltages in accordance with an operation of the control circuit of FIG. 2.

Operation of the control circuit 201 of FIG. 2 is described with reference to FIG. 3. FIG. 3 is a plot of voltages in accordance with an operation of the control circuit 201.

The threshold voltage $V_{th}$ is shown at 301 as 0V prior to the controller circuit being powered up. After $V_{th}$ goes to its initial voltage level at 303, $V_{OUT}$ is shown beginning to ramp up from 0V. Referring to FIG. 2, the controller 200 initially activates switch 222 so that it acts as a closed switch and couples the output of the comparator 204 to control nodes of switches 220, 221. Switch 220 is activated (e.g., closed) by the non-zero voltage to couple its respective source charge pump 210 to the output node 250 to begin to charge up the output node 250 as shown by the $V_{OUT\_NODE}$ ramping voltage 305 of FIG. 3. The controller has deactivated switch 221 its respective remove the sink charge pump 211 from the output node 250. The controller 200 has deactivated switch 223 (e.g., open) at this time so that the output of the linear amplifier 202 is not coupled to the output node 250. The ramping output node voltage $V_{OUT\_NODE}$ is fed back to the linear amplifier 202 to be compared to the feedback voltage $V_{fb}$ that is now acting as a threshold voltage.

Once the output node voltage $V_{OUT\_NODE}$ has passed the threshold voltage (e.g., $V_{fb}$) at 310, the controller 200 senses $V_{OUT\_NODE}$ exceeding the threshold and deactivates (e.g. opens) switch 220, thus removing the source charge pump 210, from being coupled to the output node 250. Once the source charge pump 210, have been removed from supplying a current to the output node 250, the output voltage $V_{OUT}$ shown in FIG. 3 drops back down below the threshold voltage $V_{th}$ by activation of the sink charge pump 211 and switch 221. Once $V_{OUT\_NODE}$ drops below $V_{th}$, the controller senses $V_{OUT\_NODE}$ dropping below the threshold and activates (e.g., closes) switch 220 and the respective source charge pump 210 is again coupled to the output node 250. This repeats for a number of times (e.g., greater than one) as shown at 313 of FIG. 3.

The area of 313 shows the output voltage $V_{OUT\_NODE}$ toggle around the threshold voltage $V_{th}$ a number of times (e.g., greater than 1). Thus, the phrase "toggle around" is defined as exceeding the threshold voltage, going back below the threshold voltage, then exceeding the threshold voltage again.

After the certain number of repeated charging and discharging of the output node 250 as sensed and counted by the controller 200, the controller deactivates (e.g., opens) switch 222 to remove the comparator 204 from activating switches 220, 221. The source charge pump 210 is now no longer coupled to the output node 250 and the sink charge pump 211 is not activated. The controller 200 also activates (e.g., closes) switch 223 so that the output of the linear amplifier 202 is now coupled to the output node 250. As can be seen in FIG. 3, the controller 200 waits until $V_{OUT\_NODE}$ exceeds $V_{fb}$ before deactivating switch 222 for the final time and activating switch 223.

The output of the linear amplifier 202 is initially greater than $V_{th}$ but is driven by 202 to eventually be equal to $V_{th}$ at voltage 320. At voltage 320 when $V_{OUT\_NODE}$ and $V_{th}$ are now equal (e.g., within ±0.5V), control of the power supply controller is handed over from the primary controller to the secondary controller.

In another embodiment, when the output voltage $V_{OUT\_NODE}$ toggles around $V_{th}$, as shown by area 313 of FIG. 3, the controller 200 may adjust (e.g., decrease) the time of activating and deactivating switch 222 in order to decrease the overshoot and undershoot voltages for each cycle. This may be accomplished by the controller 200 counting the number of overshoot/undershoot cycles and decreasing both the time the switch 222 is deactivate and the time that it is activated by a certain time difference. This time difference can then be decreased for each subsequent cycle until the certain number of cycles have been counted. In another embodiment the number of toggles can be extended for another voltage to equalize or reach a steady state or the circuit is ready for operation in a different part of the overall circuit or another circuit is ready for the proper (glitch free) operation after the secondary controller takes over control.

Figure 4:
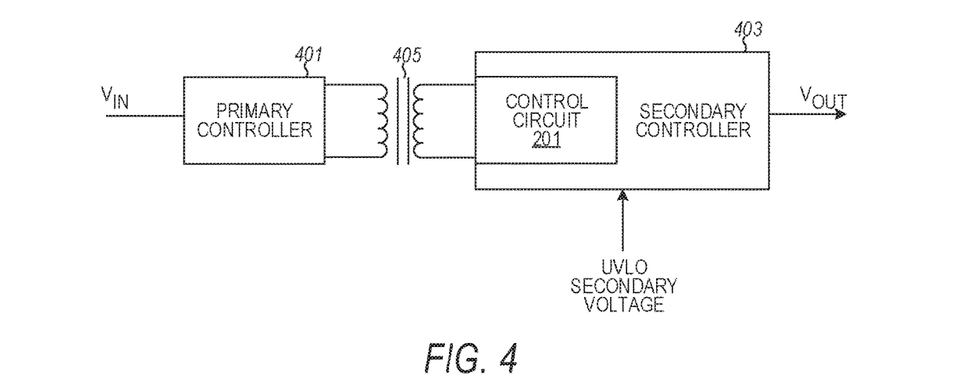
FIG. 4 is a block diagram of a power supply controller having multiple controllers controlled by the control circuit, such as in accordance with various embodiments.

FIG. 4 is a block diagram of a power supply controller having multiple controllers 401, 403 controlled by the control circuit 201, such as in accordance with various embodiments. The block diagram of FIG. 4 is a simplified diagram of a power supply controller for purposes of illustrated operation of the control circuit 201. Other embodiments may include additional elements.

The block diagram includes a primary controller 401, a secondary controller 403, a transformer 405, and the control circuit 201 as described previously. The primary controller 401 and the secondary controller 403 are isolated by and communicate through the micro-transformer 405. The isolation of the primary side from the secondary side may be defined as multiple megaohms of resistance between the grounds of the two sides.

The primary controller 401 is coupled to the control circuit 201 described previously through the micro-transformer 405.

The secondary controller 403 is coupled to the output of the control circuit 201. In other embodiments, control circuit 201 is part of secondary controller 403. The output voltage $V_{OUT}$, that powers the secondary controller 403 or is powered from some other source on the secondary side, is output to the secondary controller 403 from the control circuit 201. The UVLO secondary voltage, as shown in FIG. 1, is input to the secondary controller 403 to cause the secondary controller 403 to begin its power up sequence.

Using the method described subsequently with reference to FIG. 7, control of the power supply controller is initially handled by the primary controller 401. Once $V_{OUT}$ reaches a threshold voltage, control is handed over from the primary controller 401 to the secondary controller 403.

Figure 5:
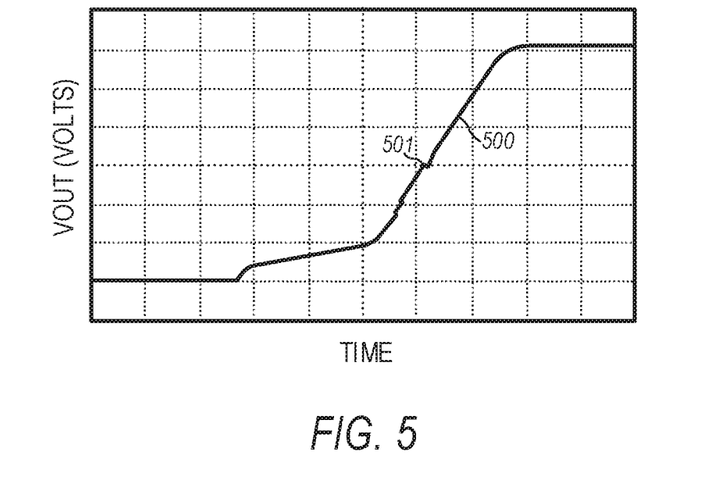
FIG. 5 is a plot of $V_{OUT}$ versus time for a conventional power supply controller.

FIG. 5 is a plot of $V_{OUT}$ versus time for a conventional power supply controller. The plot shows that as $V_{OUT}$ rises 500, a voltage offset 501 occurs at the point where the primary controller hands over control of monitoring the $V_{OUT}$ output to the secondary controller.

Figure 6:
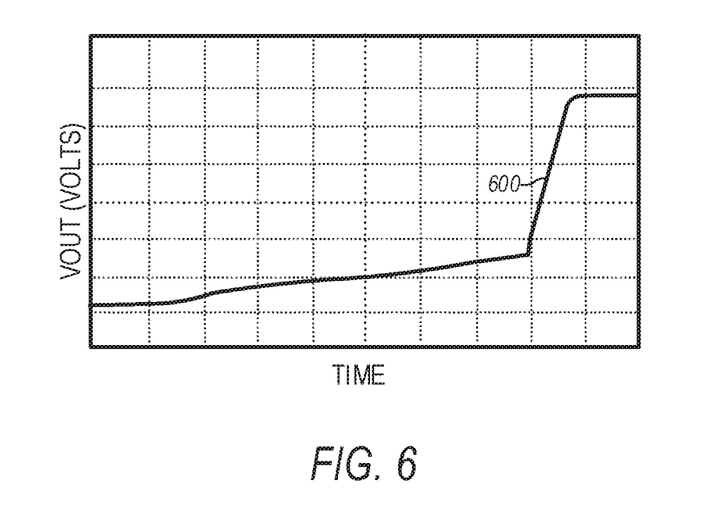
FIG. 6 is a plot of $V_{OUT}$ versus time for a power supply controller using the control circuit for controlling output voltage to reduce the offset voltage, such as in accordance with various embodiments.

FIG. 6 is a plot of $V_{OUT}$ versus time for a power supply controller using the control circuit for controlling output voltage to reduce the offset voltage, such as in accordance with various embodiments. This plot shows that as the $V_{OUT}$ rises 600, the voltage offset present in the conventional power supply controller output has been removed by the present embodiments.

Figure 7:
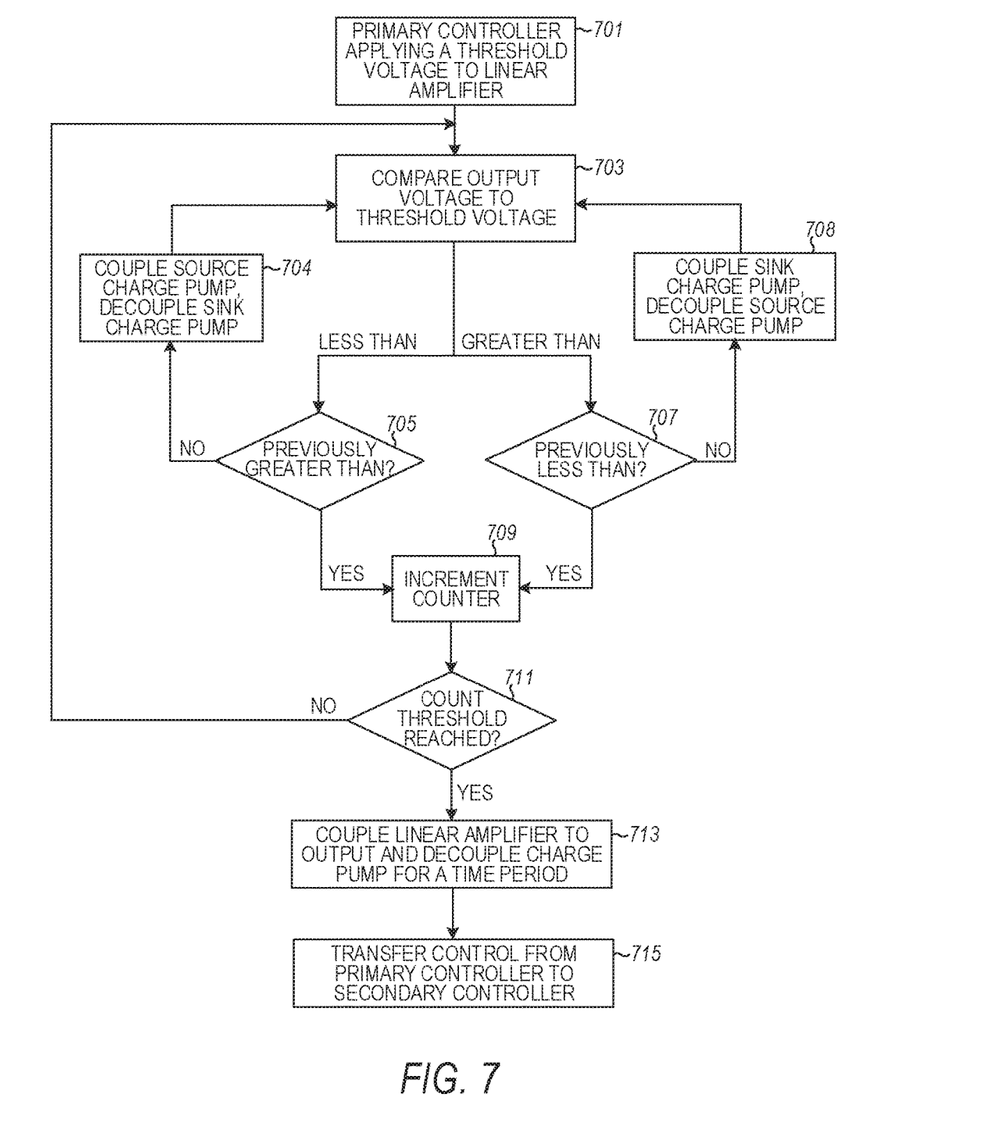
FIG. 7 is a flowchart of a method for controller handover in a power supply controller, such as in accordance with various embodiments.

FIG. 7 is a flowchart of a method for control handover in a power supply controller, such as in accordance with various embodiments. Block 701 includes a primary controller applying an input voltage ($V_{th}$) (e.g., threshold voltage) to a linear amplifier. Block 703 includes comparing the feedback output voltage that powers a secondary controller to the threshold voltage. Blocks 704, 705, 707, 708, and 709 then determine the number of times that the output voltage toggles around the threshold voltage.

When the output voltage is less than the threshold voltage, block 705 determines if the output voltage was previously greater than the threshold voltage. If the output voltage is now less than the threshold voltage and the output voltage was previously less than the threshold voltage, the source charge pump is coupled to the output node and the sink charge pump is decoupled from the output node in block 704. When the output voltage is greater than the input voltage, block 707 determines if the output voltage was previously less than the threshold voltage. If the output voltage is now greater than the threshold voltage and was previously greater than the threshold voltage, block 708 includes coupling the sink charge pump to the output of the power supply controller and decoupling the source charge pump.

If the output voltage is now less than the threshold voltage but the output voltage was previously greater than the threshold voltage, block 709 increments a counter. When the output voltage is greater than the input voltage but the output voltage was previously less than the threshold voltage, block 709 increments the counter. The counter counts the number of times the output voltage toggles around the threshold voltage.

Block 711 determines if the count has reached a threshold count. If the threshold has not been reached (e.g., the output voltage has not toggled around the threshold voltage the certain number of times), the process repeats from block 703. If the count threshold has been reached, block 713 couples the linear amplifier output to the output of the circuit and decouples the source charge pump for a time period x. The time period x is a predetermined time that determines how long the linear amplifier operates before the rest of the control circuitry takes over.

Block 715 includes transferring control of the power supply controller from the primary controller to the secondary controller when the output voltage equals the threshold voltage after the output voltage has toggled around the threshold voltage for the number of times and the output of the linear amplifier is coupled to the output of the power supply controller.

The above detailed description includes references to the accompanying drawings, which form a part of the detailed description. The drawings show, by way of illustration, specific embodiments in which the invention can be practiced. These embodiments are also referred to herein as "examples". All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B", "B but not A", and "A and B", unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A control circuit for controlling an output voltage to reduce an offset voltage in the output voltage, the control circuit comprising:
   a linear amplifier having a threshold voltage input node, a feedback voltage input node, and a comparator output node switchably coupled to an output node of the control circuit, the feedback voltage input node coupled to the output node of the control circuit;
   a charge pump switchably coupled to the output node of the control circuit; and
   a controller configured to control coupling of the charge pump to the output node of the control circuit when the output voltage is less than a threshold voltage on the threshold voltage input node, the controller further configured to control coupling of the comparator output node to the output node of the control circuit when the output voltage is greater than the threshold voltage.

2. The control circuit of claim 1, wherein the charge pump comprises a source charge pump.

3. The control circuit of claim 2, further comprising:
a first switch that couples the source charge pump to the output node of the control circuit; and
a second switch that couples an output of the amplifier to a control node of the first switch;
wherein the controller is further configured to activate the second switch such that the output of the amplifier is coupled to and activates the first switch when the output voltage is less than the reference voltage.

4. The control circuit of claim 3, further comprising a sink charge pump switchably coupled between the output node of the control circuit and a common node of the control circuit.

5. The control circuit of claim 4, wherein a third switch coupling the sink charge pump to the output node of the control circuit is controlled by the output of the amplifier such that the third switch operates in a complementary manner to the first switch.

6. The control circuit of claim 1, wherein the controller is further configured to control coupling of the linear amplifier output node to the output node of the control circuit when the output voltage exceeds the threshold voltage a specified number of times greater than one.

7. The control circuit of claim 6, wherein the controller is further configured to count a plurality of times that the output voltage exceeds the threshold voltage prior to control coupling of the linear amplifier output node to the output node of the control circuit.

8. The control circuit of claim 1, wherein the linear amplifier comprises an operational amplifier and the feedback voltage input node comprises an inverting input of the operational amplifier.

9. The control circuit of claim 1, wherein the comparator comprises hysteresis.

10. A power supply controller for controlling an output voltage to reduce an offset voltage in the output voltage, the controller comprising:
a primary controller coupled to a secondary controller through a transformer; and
a control circuit coupled to the secondary controller and to the primary controller through the transformer, the control circuit comprising:
a linear amplifier having a threshold voltage input node, a feedback voltage input node, and a comparator output node switchably coupled to an output node of the control circuit, the feedback voltage input node coupled to the output node of the control circuit;
a source charge pump switchably coupled to the output node of the control circuit; and
a controller configured to control coupling of the source charge pump to the output node of the control circuit when the output voltage is less than a threshold voltage on the threshold voltage input node, the controller further configured to control coupling of the comparator output node to the output node of the control circuit after the output voltage has toggled around the threshold voltage for a number of times.

11. The power supply controller of claim 10, wherein the controller is configured to control coupling of the comparator output node to the output node of the control circuit after the output voltage has toggled around the threshold voltage for the number of times that is specified to be greater than one time.

12. The power supply controller of claim 10, wherein the primary controller is configured to provide an input voltage to the control circuit, through the transformer, to power the control circuit.

13. The power supply controller of claim 12, wherein the output node of the control circuit is coupled to the secondary controller such that the output voltage powers the secondary controller.

14. The power supply controller of claim 10, wherein the controller is further configured to count the number of times the output voltage toggles around the threshold voltage such that the comparator output node is coupled to the output node of the control circuit after the output voltage has exceeded the threshold voltage.

15. The power supply controller of claim 10, wherein the secondary controller is configured to take control of the power supply controller from the primary controller after the output voltage and the threshold voltage are equal.

16. A method for control handover in a power supply controller, the method comprising:
applying a threshold voltage from a primary controller to a linear amplifier;
comparing an output node voltage that powers a secondary controller to the threshold voltage;
coupling a comparator output node to an output node of the power supply controller in response to the output node voltage being greater than the threshold voltage and the output node voltage has toggled around the threshold voltage a number of times; and
transferring control of the power supply controller from the primary controller to the secondary controller when the output node voltage equals the threshold voltage after the output node voltage has toggled around the threshold voltage for the number of times and the comparator output node is coupled to the output node of the power supply controller.

17. The method of claim 16, further comprising a control circuit counting a number of times that the output node voltage toggles around the threshold voltage.

18. The method of claim 16, further comprising:
if the output node voltage is less than the threshold voltage, coupling a source charge pump to the output of the power supply controller;
if the output node voltage is greater than the threshold voltage, decoupling the source charge pump from the output node of the power supply controller and coupling a sink charge pump to the output node of the power supply controller;
counting the number of times that the output node voltage has toggled around the threshold voltage in response to coupling the source charge pump or coupling the sink charge pump to the output node of the power supply controller.

19. The method of claim 16, wherein transferring control of the power supply controller from the primary controller to the secondary controller when the output node voltage equals the threshold voltage comprises transferring control after waiting a time after the output node voltage has exceeded the threshold voltage until the output node voltage has discharged from a voltage that exceeds the threshold voltage to the input voltage.

20. The method of claim 16, further comprising the secondary controller monitoring and controlling the output node voltage after transferring control from the primary controller to the secondary controller.

* * * * *